(12) United States Patent
Wu et al.

(10) Patent No.: US 7,030,011 B2
(45) Date of Patent: Apr. 18, 2006

(54) METHOD FOR AVOIDING SHORT-CIRCUIT OF CONDUCTIVE WIRES

(75) Inventors: Kuo-Chien Wu, Miaoli (TW); Ping Hsu, Taipei (TW)

(73) Assignee: Nanya Technology Corporation, Taoyuan (TW)

( * ) Notice: Subject to any disclaimer, the term of this patent is extended or adjusted under 35 U.S.C. 154(b) by 152 days.

(21) Appl. No.: 10/739,342

(22) Filed: Dec. 19, 2003

(65) Prior Publication Data

US 2005/0032343 A1    Feb. 10, 2005

(30) Foreign Application Priority Data

Aug. 5, 2003    (TW) ............................... 92121411 A

(51) Int. Cl.
*H01L 21/4763* (2006.01)

(52) U.S. Cl. ..................................................... 438/639

(58) Field of Classification Search ................ 438/597, 438/618, 622–626, 631, 666–667, 672, 639
See application file for complete search history.

(56) References Cited

U.S. PATENT DOCUMENTS

| | | | | |
|---|---|---|---|---|
| 5,874,359 A | * | 2/1999 | Liaw et al. | 438/640 |
| 5,940,714 A | * | 8/1999 | Lee et al. | 438/396 |
| 6,051,469 A | * | 4/2000 | Sheu et al. | 438/270 |
| 6,066,556 A | * | 5/2000 | Jeong | 438/639 |
| 6,071,804 A | * | 6/2000 | Gau | 438/618 |
| 6,117,757 A | * | 9/2000 | Wang et al. | 438/596 |
| 6,329,244 B1 | * | 12/2001 | Wu et al. | 438/256 |
| 6,524,907 B1 | * | 2/2003 | Parekh et al. | 438/253 |
| 6,787,906 B1 | * | 9/2004 | Yang et al. | 257/758 |
| 2003/0022486 A1 | | 1/2003 | Wu | |
| 2005/0101141 A1 | * | 5/2005 | Lin et al. | 438/692 |

\* cited by examiner

*Primary Examiner*—Evan Pert
(74) *Attorney, Agent, or Firm*—Birch, Stewart, Kolasch & Birch, LLP

(57) ABSTRACT

A method for avoiding short circuits between conductive wires. The method includes providing a substrate having a contact area, forming a first opening in the substrate to expose the contact area, filling the first opening with a first conductive material to form a first conductive layer, removing a portion of the first conductive layer to form a second opening, in order to expose a sidewall of the substrate, forming a spacer on the sidewall, depositing a poly-silicon layer over the substrate to fill the second opening to form a second conductive layer, etching back the poly-silicon layer to expose a portion of the spacer, forming a patterned dielectric layer over the substrate to define a wire opening in order to expose the second conductive layer, and filling the wire opening with a third conductive material to form a wire electrically connected with the second conductive layer.

18 Claims, 7 Drawing Sheets

METHOD FOR AVOIDING SHORT-CIRCUIT OF CONDUCTIVE WIRES

FIELD OF THE INVENTION

A method for avoiding a short circuit between the conductive wires is provided, and more particularly, a method for avoiding a short circuit between the conductive wires during a semiconductor process.

BACKGROUND OF THE INVENTION

With growing technology, the requirement of the dimension of semiconductor process becomes smaller and more complex, especially in processes of ultra large-scale integration circuits. Short-circuit problems come along with the smaller critical dimension among wires, and seriously influence the yield rate and the reliability of the integration circuits. Especially in the complex integration circuits, wires and contacts made by etching and deposition (for example, bit-line contacts) often have short-circuit problems just because slight inaccuracy occurs when the process window is insufficient during manufacturing process.

FIG. 1 shows a top view of the wires and bit-line contacts of the prior art. FIG. 1 shows the relative locations of gates 103, wires 105 and bit-line contacts 101. The schematic diagram of I–I' section is shown in FIG. 2. FIG. 2 illustrates the wires and bit-line contacts of the prior art. In FIG. 2, an insulation layer 203, which has a predetermined opening, is on the semiconductor substrate 201, and the conductive layer 205 is disposed in the opening. As shown in FIG. 2, there are three wires 105 created by a metallic deposition process. Two of the wires 105 are connected to the conductive layer 205 respectively. The short-circuit problem usually happens after the wires 105 have been deposited if an improper etching process causes an over-scale trench (Illustrated in FIG. 2).

SUMMARY OF THE INVENTION

A method for avoiding short circuits between the conductive wires is provided. The method of the present invention includes an additional spacer process to avoid contacting between the wires and the bit-line contact to increase the yield rate and reliability.

A method for avoiding short circuits between a conductive wire and a bit-line contact in a semiconductor process is also provided.

According to the claimed invention, the method for avoiding short-circuit wires comprises providing a substrate having a contact area, forming a first opening in the substrate to expose the contact area, filling the first opening with a first conductive material to form a first conductive layer, removing a portion of the first conductive layer to form a second opening for exposing a sidewall of the substrate, forming a spacer on the sidewall, depositing a poly-silicon layer over the substrate to fill the second opening to form a second conductive layer, etching back the poly-silicon layer to expose a portion of the spacer, forming a patterned dielectric layer over the substrate to define a wire opening in order to expose the second conductive layer, and filling the wire opening with a third conductive material to form a wire, which is electrically connected with the second conductive layer.

Further scope of the applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DETAILED DESCRIPTION OF THE INVENTION

The present invention provides a method for avoiding short circuits between conductive wires. The preferred embodiment of the present invention illustrates the wires of the semiconductor component, for example, the wires and bit-line contacts of dynamic random access memory (DRAM). Besides, the method also can be applied to other processes to solve the short-circuit problems.

Figure 1:
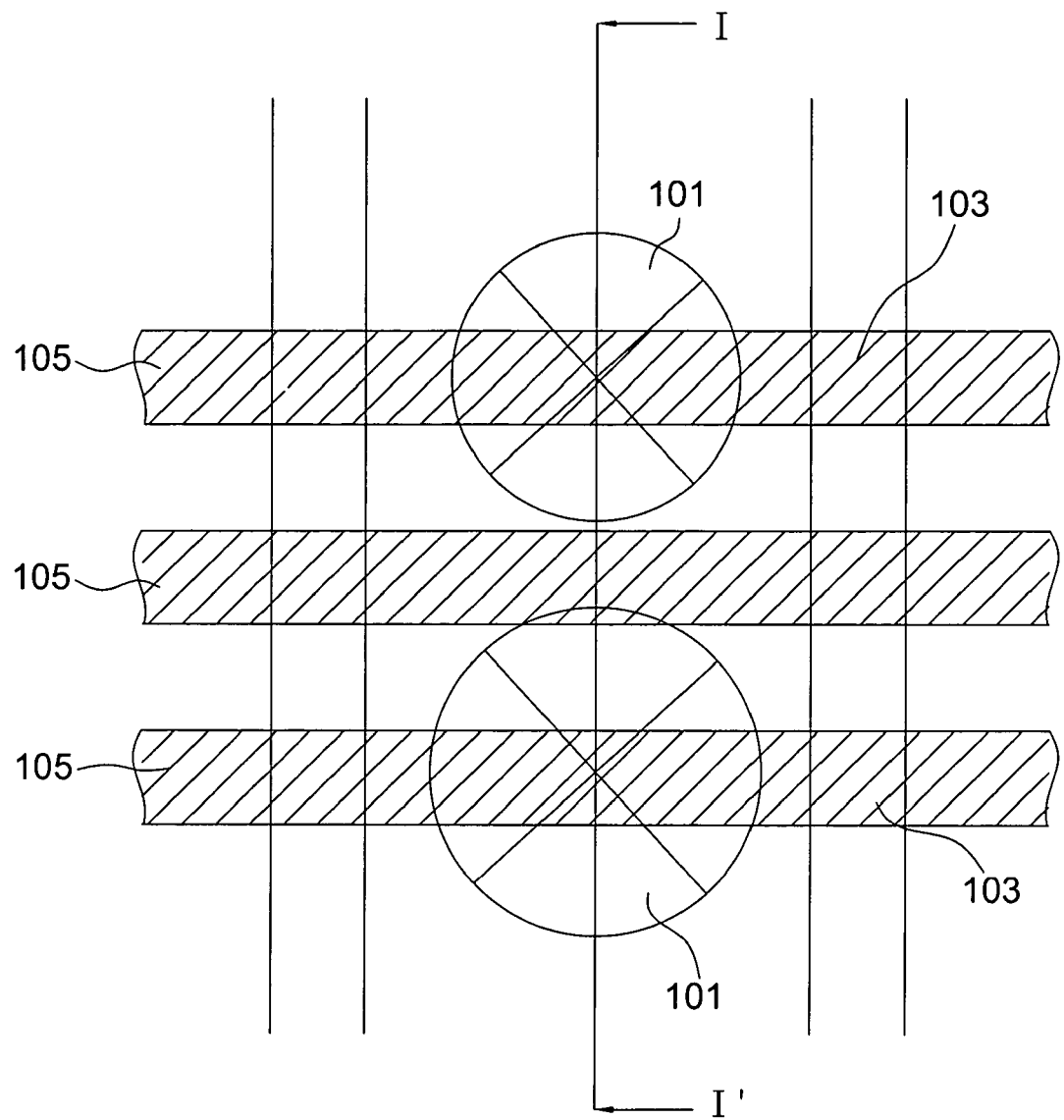
FIG. 1 is a top view of the wires and bit-line contacts of prior art.
Figure 2:
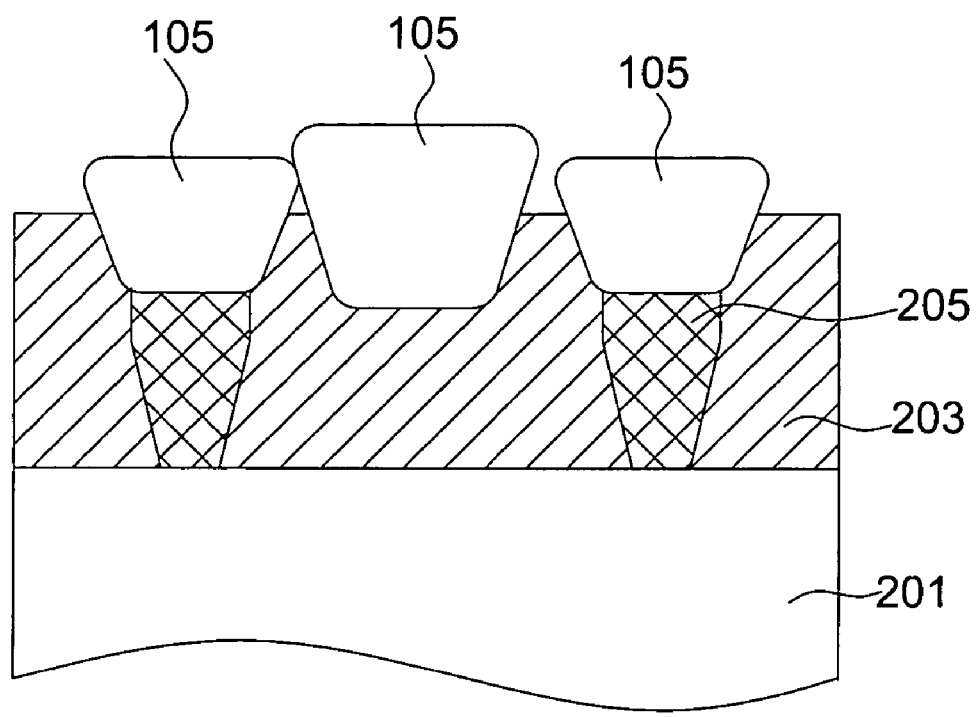
FIG. 2 is a schematic diagram of the wires and bit-line contacts of prior art.
Figure 3A:
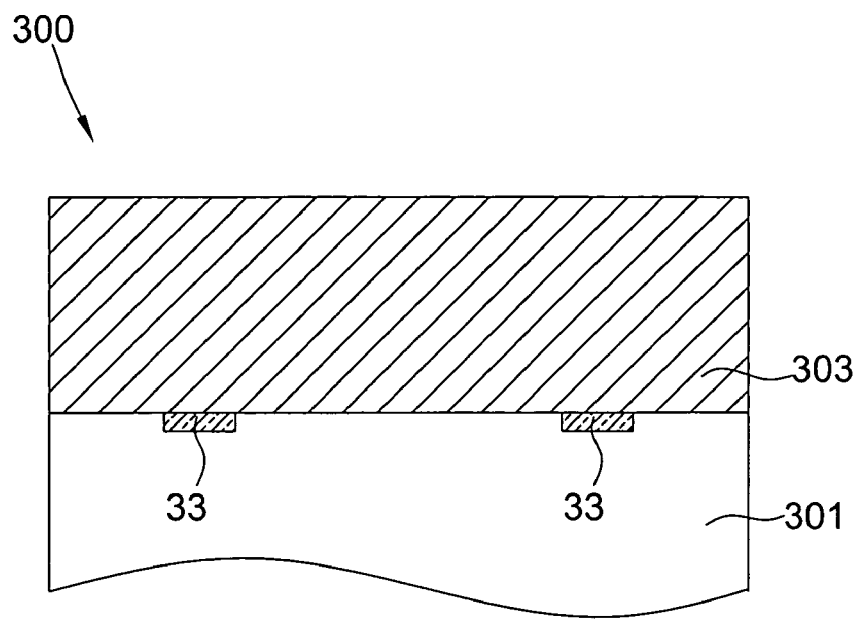
FIG. 3a is a schematic diagram of the embodiment of the present invention.

FIG. 3a shows a schematic diagram of the embodiment of the present invention. A substrate 300 includes a semiconductor substrate 301, having a contact area 33 inside, and an insulation layer 303 on it. The substrate 300 is provided for the manufacture of the integration components.

Figure 3B:
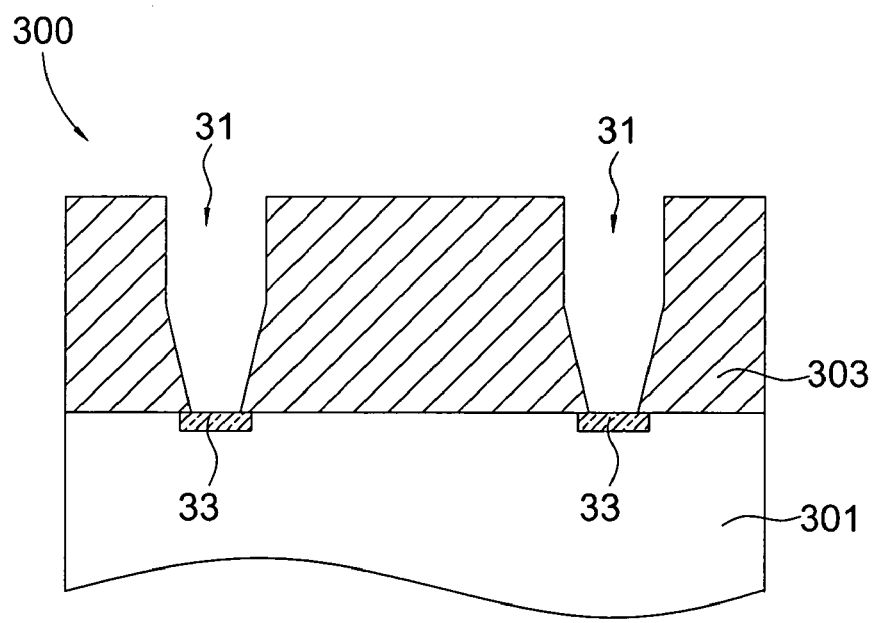
FIG. 3b is a schematic diagram of the embodiment of the present invention.

FIGS. 3b–3e show schematic diagrams of the embodiment of the present invention, and the order of the Figures follows the manufacturing process sequence. As shown in FIG. 3b, a first opening 31 is formed at the insulation layer 303 of the substrate 300 to expose the contact area 33. The contact area 33 could be a bit-line contact area. The first openings 31 can be formed by photolithography and etching processes. The first opening 31 is used for the deposition of a conductive layer follow up, and the disposition process is determined in accordance with the design. The steps of forming the first opening 31 includes: forming a patterned photoresist layer on the insulation layer 303; the patterned photoresist layer defining a location of forming the first opening 31; using the photoresist layer as a mask to etching the insulation layer 303 to expose the bit-line contact area 33.

Figure 3C:
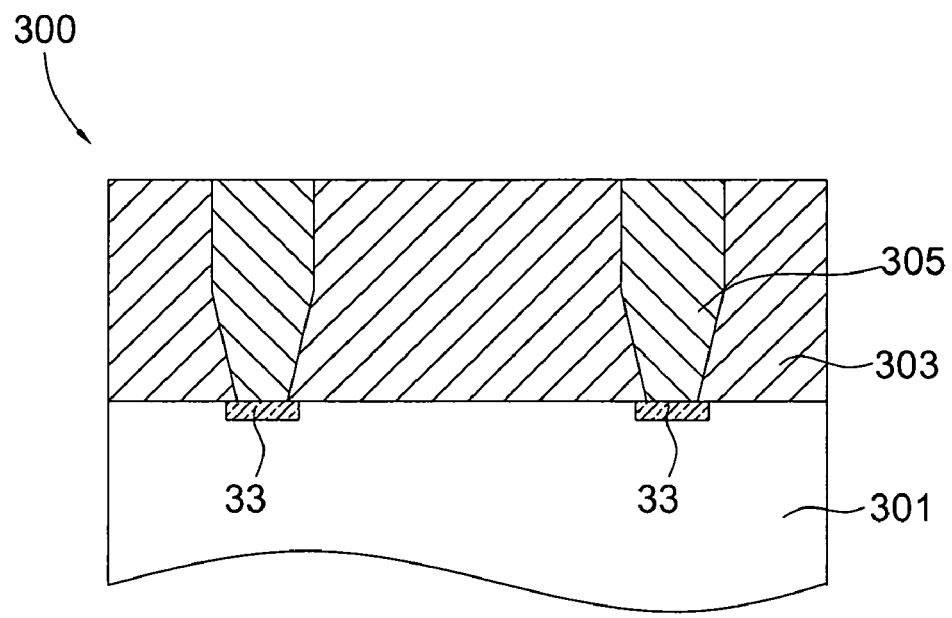
FIG. 3c is a schematic diagram of the embodiment of the present invention.

As shown in FIG. 3c, the first opening 31 is filled with a first conductive material to form a first conductive layer 305, which electrically connects to the contact area 33. The first conductive material could be poly-silicon or other similar substances. The steps of forming the first conductive layer 305 include: depositing a poly-silicon layer over the substrate 300 and filling the first opening 31.

Figure 3D:
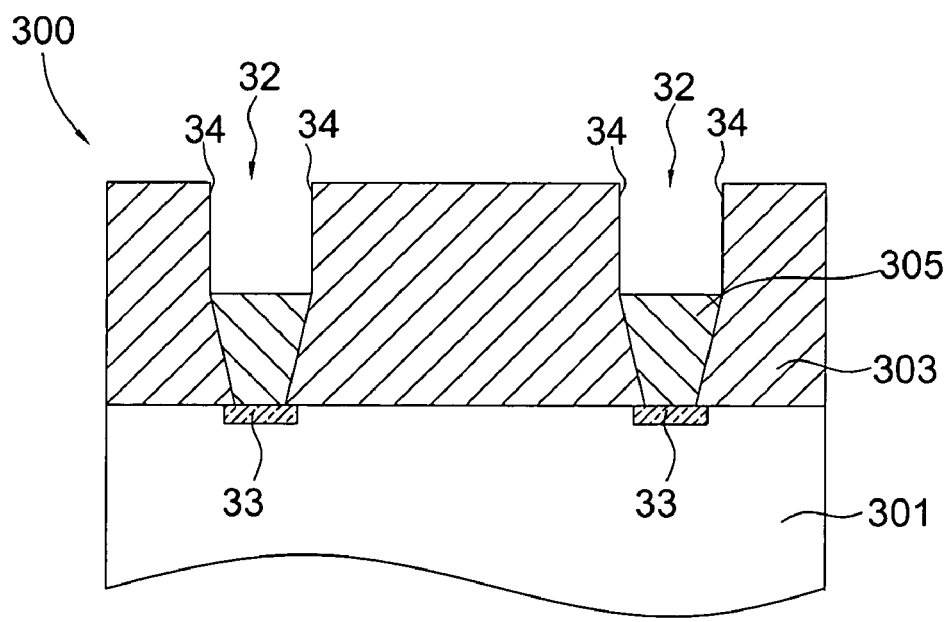
FIG. 3d is a schematic diagram of the embodiment of the present invention.

As shown in FIG. 3d, a portion of the first conductive layer 305 is removed to form a second opening 32 for exposing a sidewall 34 of the substrate 300. The method of forming the second opening 32 could be etching back the first conductive layer 305.

Figure 3E:
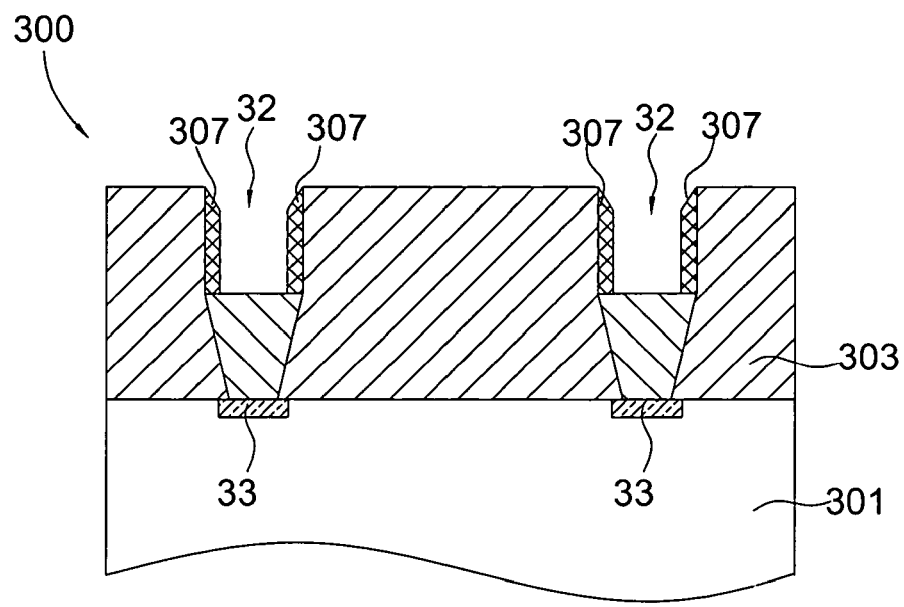
FIG. 3e is a schematic diagram of the embodiment of the present invention.

As shown in FIG. 3e, a plurality of spacers 307 is formed on the corresponding sidewalls 34. The spacer 307 could be made of nitride oxide or other similar substances. The steps of forming the spacer 307 include: forming a conformal dielectric layer over the substrate 300, and anisotropically etching the conformal dielectric layer to form the spacer 307 on the sidewall 34.

Figure 3F:
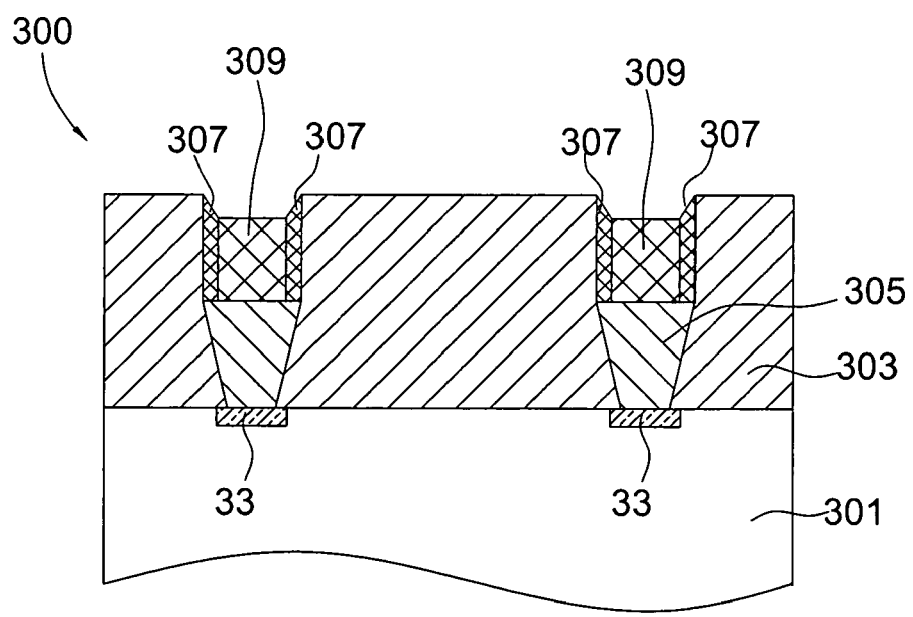
FIG. 3f is a schematic diagram of the embodiment of the present invention.

As shown in FIG. 3f, the second opening 32 is filled with a second conductive material to form a second conductive layer 309. The second conductive material could be poly-silicon or other similar substances. The steps of forming the second conductive layer 309 include: depositing a poly-silicon layer over the substrate 300, filling the second opening 32 with the poly-silicon layer, and etching back the poly-silicon layer to expose a portion of the spacer 307.

Figure 3G:
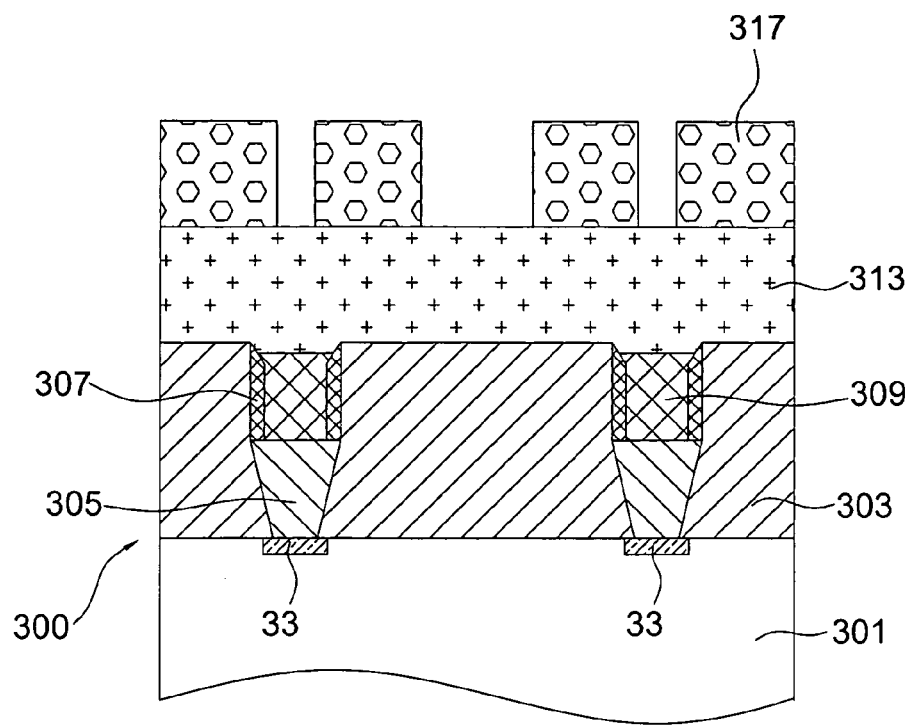
FIG. 3g is a schematic diagram of the embodiment of the present invention.

As shown in FIG. 3g, a dielectric layer 313 is formed over the substrate 300 and the second conductive layer 309. Then the dielectric layer 313 is polished with chemical-mechanical polishing method. Thereafter, a patterned photoresist 317 is formed on the dielectric layer 313.

Figure 3H:
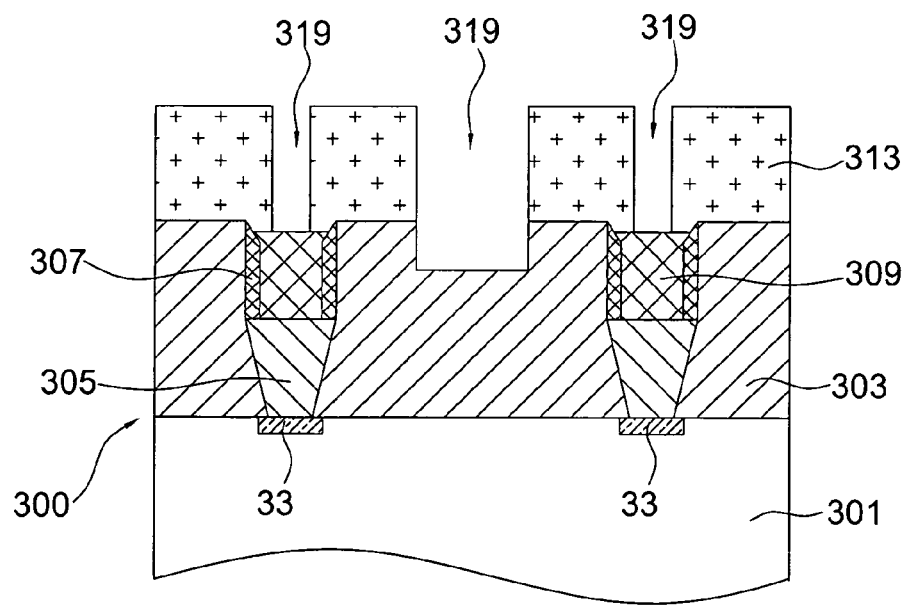
FIG. 3h is a schematic diagram of the embodiment of the present invention.

As shown in FIG. 3h, the patterned photoresist 317 defines locations of forming wire openings 319. The pattern photoresist 317 is used as a mask and the dielectric layer 313 is etched to form the wire openings. Some wire openings 319 are located on the second conductive layer 309 and expose the second conductive layer 309. Another wire opening 319 is located on the, insulation layer 303. Then the patterned photoresist 317 is removed.

Figure 3I:
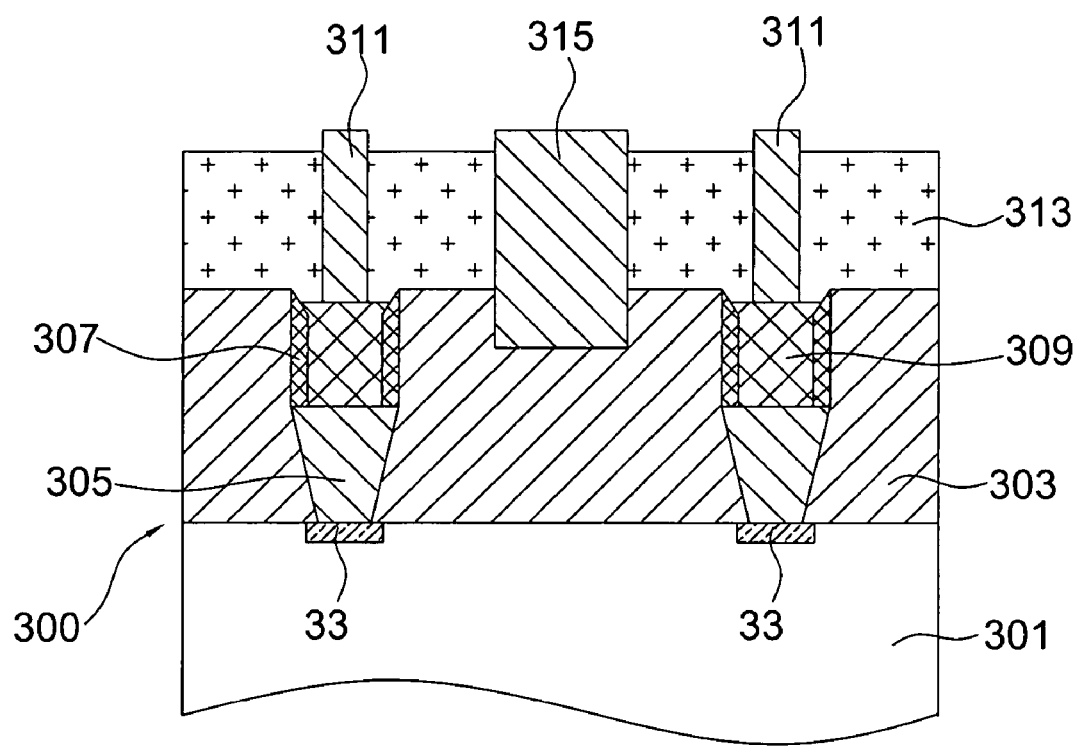
FIG. 3i is a schematic diagram of the embodiment of the present invention.

As shown in FIG. 3i, the wire opening 319 is filled with a third conductive material to form the wires 311 and 315. The wires 311 electrically connect with the second conductive layer 309, respectively The third conductive material can be wolfram or other similar metals. The steps of forming the wire include: forming a metallic layer over the patterned dielectric layer 313, filling the wire opening 319, and planarizing the metallic layer to form the wires 311 and 315.

As shown in FIG. 3i, the first conductive layer 305 is electrically connected to the second conductive layer 309 in this embodiment and treated together as a bit-line contact. The spacer 307 of the present invention can increase the distance between the wire 315 and the bit-line contact to effectively avoid short circuits from occurring.

While the invention has been described in connection with what is presently considered to be the most practical and preferred embodiments, it is to be understood that the invention is not to be limited to the discovered embodiments. The invention is intended to cover various modifications and equivalent arrangement included within the spirit and scope of the appended claims.

The invention claimed is:

1. A method for avoiding short-circuit of conductive wires, comprising:

providing a substrate having a contact area;
forming a first opening in the substrate to expose the contact area;
filling the first opening with a first conductive material to form a first conductive layer;
removing a portion of the first conductive layer to form a second opening for exposing a sidewall of the substrate;
forming a spacer on the sidewall;
depositing a poly-silicon layer over the substrate to fill the second opening to form a second conductive layer;
etching back the poly-silicon layer to expose a portion of the spacer;
forming a patterned dielectric layer over the substrate, the patterned dielectric layer defining a wire opening to expose the second conductive layer; and
filling the wire opening with a third conductive material to form a wire electrically contacting the second conductive layer.

2. The method of claim 1, wherein the substrate includes a semiconductor substrate and an insulation layer, and the contact area is a bit-line contact area.

3. The method of claim 2, wherein the step of forming the first opening includes:

forming a patterned photoresist layer on the insulation layer, the patterned photoresist layer defining the first opening; and
using the photoresist layer as a mask to etch the insulation layer to expose the bit-line contact area.

4. The method of claim 1, wherein the step of forming the first conductive layer includes:

depositing a poly-silicon layer over the substrate, and the first opening is filled with the poly-silicon layer.

5. The method of claim 4, wherein the step of forming the second opening includes:

etching back the poly-silicon layer to expose the sidewall of the substrate.

6. The method of claim 1, wherein the step of forming the spacer includes:

forming a conformal dielectric layer over the substrate; and
anisotropically etching the conformal dielectric layer to form the spacer on the sidewall.

7. The method of claim 1, wherein the step of forming the patterned dielectric layer includes:

forming a dielectric layer over the substrate and the second conductive layer;
forming a patterned photoresist on the dielectric layer, the patterned photoresist defining the wire opening;
using the pattern photoresist as a mask to etch the dielectric layer to expose the second conductive layer; and
removing the patterned photoresist to form the patterned dielectric layer.

8. The method of claim 7, wherein the step of forming the patterned dielectric layer includes:

planarizing the dielectric layer by a chemical-mechanical polishing method.

9. The method of claim 7, wherein the step of forming the wire includes:

forming a metallic layer over the patterned dielectric layer and filling the wire opening; and
planarizing the metallic layer to form the wire.

10. A method for avoiding short-circuit of conductive wires, comprising:

providing a substrate having a contact area;
forming a first opening in the substrate to expose the contact area;

filling the first opening with a first conductive material to form a first conductive layer;

removing a portion of the first conductive layer to form a second opening for exposing a sidewall of the substrate;

forming a spacer on the sidewall;

depositing a poly-silicon layer over the substrate to fill the second opening to form a second conductive layer; and etching back the poly-silicon layer to expose a portion of the spacer;

forming a patterned dielectric layer over the substrate, the patterned dielectric layer defining a plurality of wire openings to expose the second conductive layer and a portion of the substrate; and filling the plurality of wire openings with a third conductive material to form a plurality of wires, at least one of the plurality of wires electrically contacting the second conductive layer, and at least one of the plurality of wires electrically insulating the second conductive layer.

11. The method of claim 10, wherein the substrate includes a semiconductor substrate and an insulation layer, and the contact area is a bit-line contact area.

12. The method of claim 11, wherein the step of forming the first opening includes:

forming a patterned photoresist layer on the insulation layer, the patterned photoresist layer defining the first opening; and using the photoresist layer as a mask to etch the insulation layer to expose the bit-line contact area.

13. The method of claim 10, wherein the step of forming the first conductive layer includes:

depositing a poly-silicon layer over the substrate, and fill the first opening is filled with the poly-silicon layer.

14. The method of claim 13, wherein the step of forming the second opening includes:

etching back the poly-silicon layer to expose the sidewall of the substrate.

15. The method of claim 10, wherein the step of forming the spacer includes:

forming a conformal dielectric layer over the substrate; and anisotropically etching the conformal dielectric layer to form the spacer on the sidewall.

16. The method of claim 10, wherein the step of forming the patterned dielectric layer includes:

forming a dielectric layer over the substrate and the second conductive layer;

forming a patterned photoresist on the dielectric layer, the patterned photoresist defining the plurality of wire openings;

using the pattern photoresist as a mask to etch the dielectric layer and the substrate to expose the second conductive layer and the portion of the substrate; and removing the patterned photoresist to form the patterned dielectric layer.

17. The method of claim 16, wherein the step of forming the patterned dielectric layer includes:

planarizing the dielectric layer by a chemical-mechanical polishing method.

18. The method of claim 16, wherein the step of forming the wire includes:

forming a metallic layer over the patterned dielectric layer and filling the plurality of wire openings; and planarizing the metallic layer to form the plurality of wires.

* * * * *